United States Patent [19]
Sellars

[11] Patent Number: 5,276,446
[45] Date of Patent: Jan. 4, 1994

[54] ANALOG-TO-DIGITAL CONVERTER WITH ERROR SIGNAL COMPENSATION AND METHOD FOR ITS OPERATION

[75] Inventor: Lester P. Sellars, Ottawa, Canada

[73] Assignee: Northern Telecom Limited, Montreal, Canada

[21] Appl. No.: 907,461

[22] Filed: Jul. 1, 1992

[51] Int. Cl.⁵ .............................................. H03M 1/48
[52] U.S. Cl. ..................................... 341/118; 341/172
[58] Field of Search ................. 341/118, 120, 150, 172

[56] References Cited

U.S. PATENT DOCUMENTS

| | | | |
|---|---|---|---|
| 4,295,089 | 10/1981 | Cooperman | 341/172 |
| 4,399,426 | 8/1983 | Tan | 341/172 |
| 4,812,817 | 3/1989 | Bernard | 341/172 |
| 4,922,252 | 5/1990 | Draxelmayr et al. | 341/172 |

OTHER PUBLICATIONS

"A PCM Voice Codec with On-Chip Filters", J. T. Caves, et al., IEEE Transactions on Communications, vol. Com. 27, No. 2, Feb. 1979.

Primary Examiner—Howard L. Williams
Attorney, Agent, or Firm—C. W. Junkin

[57] ABSTRACT

In an analog to-digital converter, an analog signal is applied to a signal node of a binary weighted capacitor array during a sampling interval to charge capacitors of the capacitor array. A reference voltage is selectively applied to individual capacitors of the capacitor array during a coding interval to redistribute charge among the capacitors and to thereby minimize a voltage at the signal node. A compensating signal responsive to transitions of an error producing signal is coupled to the signal node during the sampling and coding intervals. The bit pattern corresponding to the sample of the analog signal is determined from which capacitors of the array have the reference voltage applied thereto for minimizing the voltage at the signal node. The analog-to-digital converter is useful for codecs used in telephony applications for encoding and decoding voice signals and the like.

6 Claims, 4 Drawing Sheets

ANALOG-TO-DIGITAL CONVERTER WITH ERROR SIGNAL COMPENSATION AND METHOD FOR ITS OPERATION

FIELD OF THE INVENTION

This invention relates to analog-to-digital converters and to methods for their operation.

BACKGROUND OF THE INVENTION

A known analog to digital converter uses charge redistribution in a binary-weighted capacitor array to digitally encode analog signals. A sample of the analog signal is applied to a signal node to charge capacitors of the capacitor array, and a reference voltage is selectively applied to individual capacitors of the array to redistribute charge within the array until the voltage at the signal node is minimized. The pattern of reference voltages that is applied to the individual capacitors of the array to minimize the voltage at the signal node determines the bit pattern for the digitally encoded sample of the analog signal.

When such known analog-to-digital converters are implemented as part of a monolithic integrated circuit, other signals may be capacitively coupled to the signal node of the capacitor array. Such capacitive coupling causes a voltage offset at the signal node, and this voltage offset effectively shifts the decision levels for the digital encoding process away from their intended values, causing bit errors in the digitally encoded signal.

For example, the sign bit of the digitally encoded signal may be present in the integrated circuit near the signal node of the capacitor array and may be coupled to the signal node via parasitic capacitances. In known circuits, the sign bit has been inverted and integrated over time, and the integrated signal has been applied to the signal node to compensate for voltage offset due to parasitic coupling of the sign bit to the signal node. This approach averages out encoding errors over time, but particular bits of the encoded signal are still in error.

SUMMARY OF THE INVENTION

This invention provides more accurate digital encoding of analog signals by compensating for the instantaneous offset voltage due to transitions of a parasitically coupled signal by coupling a corresponding compensating signal to the signal node on a sample by sample basis.

One aspect of the invention provides an analog-to-digital converter, comprising a binary-weighted capacitor array, means for applying an analog signal to a signal node of the capacitor array to charge capacitors of the capacitor array, means responsive to transitions of an error-producing signal to couple a compensating signal to the signal node to compensate for parasitic coupling of the error-producing signal to the signal node, and means for selectively applying a reference voltage to individual capacitors of the array to redistribute charge among the capacitors and to thereby minimize a voltage at the signal node.

The means responsive to transitions of an error-producing signal to couple a compensating signal to the signal node may comprise an inverting and level shifting circuit responsive to the error producing signal and a coupling capacitor connected between the inverting and level shifting circuit and the signal node.

Another aspect of the invention provides a method for converting an analog signal to a digital signal. The method comprises applying an analog signal to a signal node of a binary-weighted capacitor array during a sampling interval to charge capacitors of the capacitor array, selectively applying a reference voltage to individual capacitors of the array during a coding interval to redistribute charge among the capacitors and to thereby minimize a voltage at the signal node, and sensing which capacitors of the array have the reference voltage applied thereto for minimizing the voltage at the signal node during a sensing interval. According to the invention, the method further comprises coupling a compensating signal responsive to transitions of an error-producing signal to the signal node during the sampling and coding intervals.

The compensating signal may be derived from the error-producing signal by inverting and level shifting the error-producing signal and capacitively coupling the resulting signal to the signal node.

Where the capacitor array is used for both analog-to-digital conversion and digital-to-analog conversion, the method may further comprise defeating the coupling of the compensating signal to the signal node while the capacitor array is used for digital- to -analog conversion.

BRIEF DESCRIPTION OF THE DRAWINGS

Embodiments of the invention are described below by way of example only. Reference is made to accompanying drawings, in which:

FIG. 1 is a schematic diagram of a circuit according to an embodiment of the invention for analog-to-digital conversion of voice signals and the like;

DESCRIPTION OF EMBODIMENTS

Figure 1:
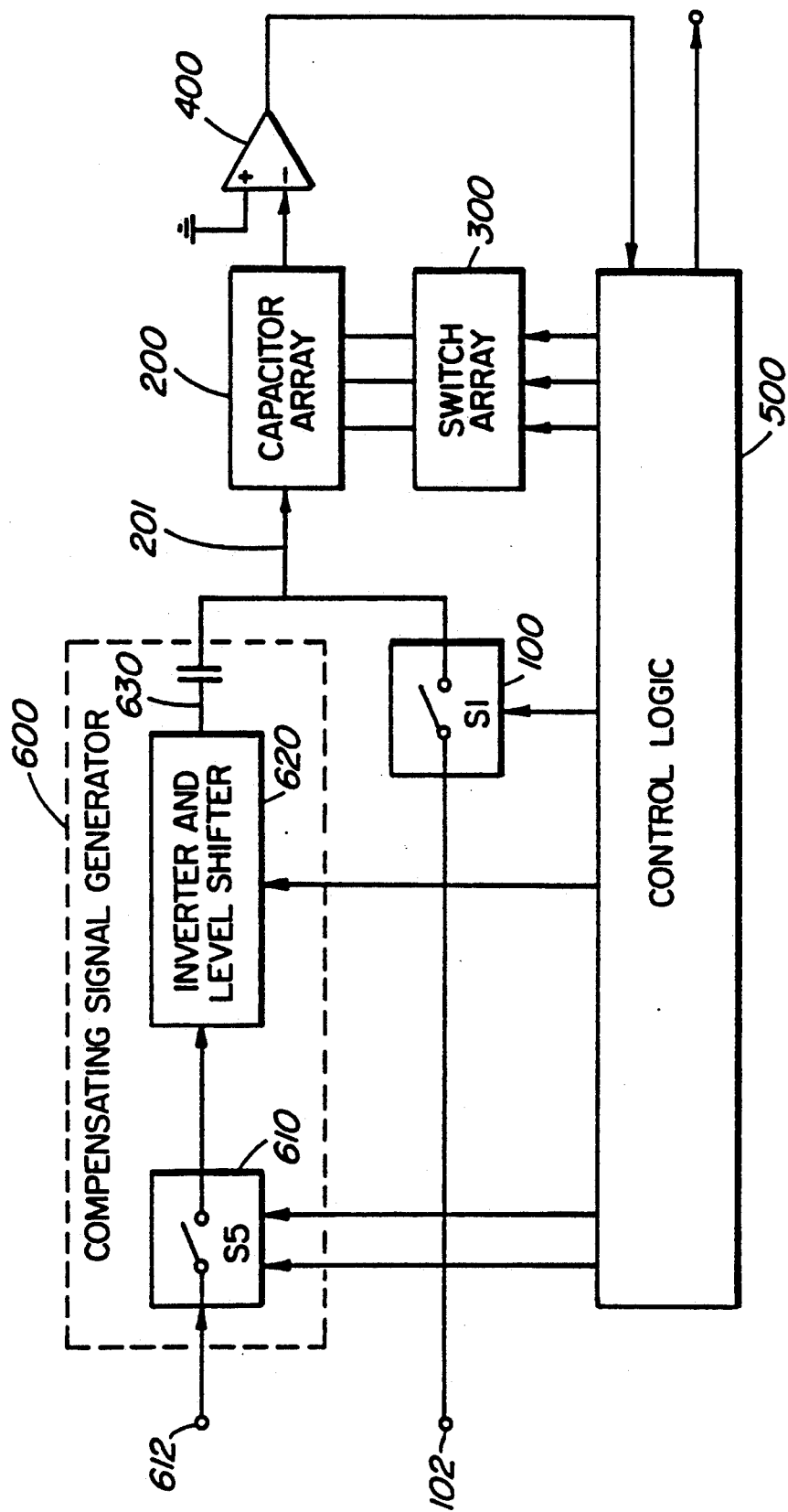

FIG. 1 is a schematic diagram of a circuit for analog-to-digital conversion of voice signals and the like. The circuit comprises a first switching circuit 100, a binary-weighted capacitor array 200, a switch array 300, a differential amplifier 400 and a control logic circuit 500. The first switching circuit 100 is connected between an analog signal input 102 and a signal node 201 of the capacitor array 200, and responds to signals provided by the control logic circuit 500 to selectively couple an analog signal voltage to the signal node 201 of the capacitor array 200.

Figure 2:
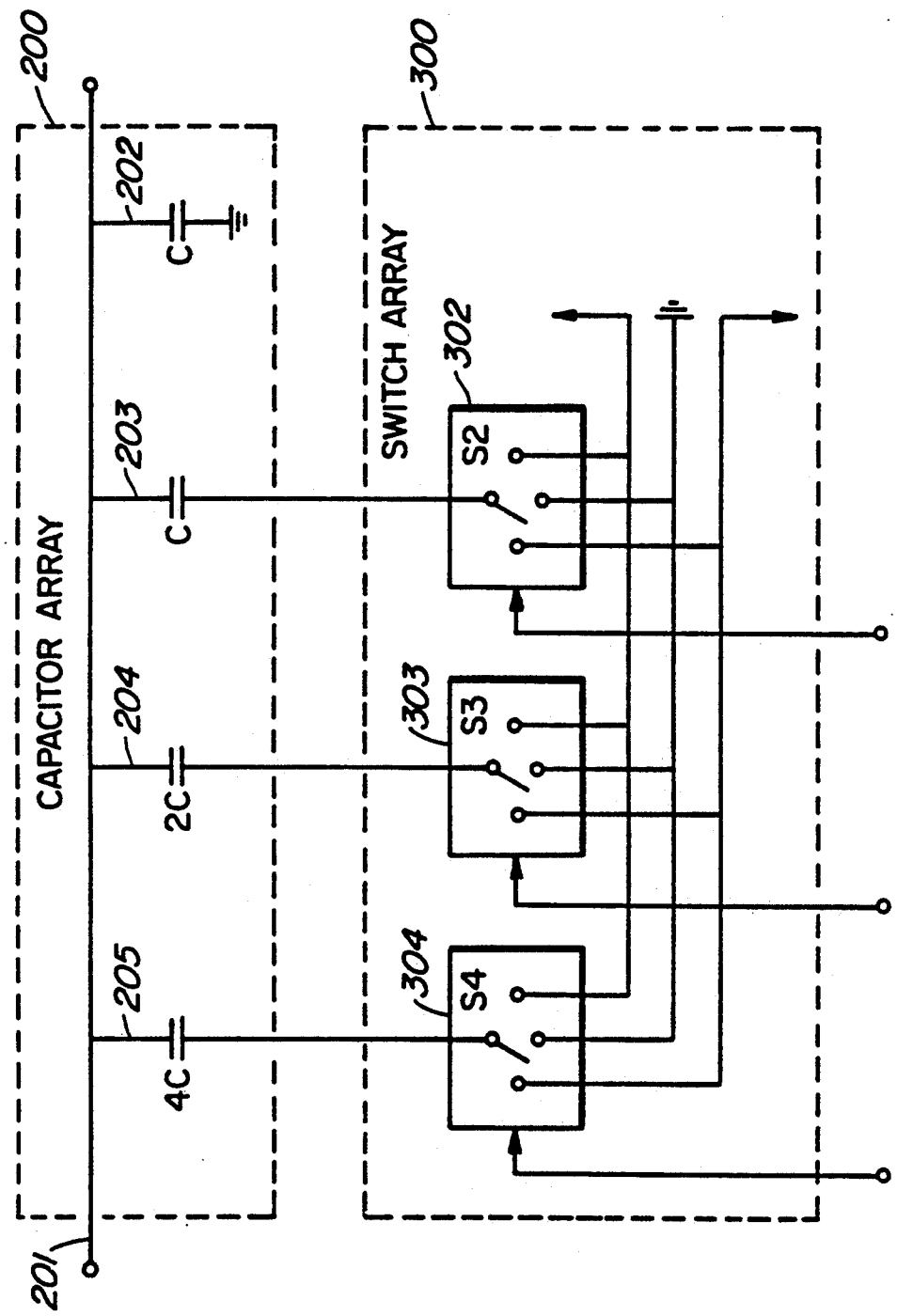
FIG. 2 is a schematic diagram showing further details of a capacitor array and a switch array of the circuit of FIG. 1.

FIG. 2 is a schematic diagram showing further details of the binary-weighted capacitor array 200 and the switch array 300. The capacitor array 200 comprises four capacitors 202-205 and the switch array comprises three switching circuits 302-304. A first capacitor 202 is connected between the signal node 201 and ground and has a first capacitance. A second capacitor 203 has a capacitance substantially equal to the first capacitance and is connected between the signal node 201 and a second switching circuit 302. A third capacitor 204 has a second capacitance substantially equal to twice the first capacitance and is connected between the signal node 201 and a third switching circuit 303. A fourth capacitor 205 has a third capacitance substantially equal to four times the first capacitance and is connected between the signal node 201 and a fourth switching circuit 304. Each of the second, third and fourth switching circuits 302-304 has first, second and third poles connected to a positive reference voltage, ground and a negative reference voltage respectively and responds to signals provided by the control logic circuit 500 to selectively couple its respective capacitor 203-205 to ground, the positive reference voltage or the negative reference voltage.

The signal node 201 of the capacitor array 200 is also connected to the negative input of the differential amplifier 400. The positive input of the amplifier 300 is grounded, and the output is connected to the control logic circuit 500.

Analog-to-digital conversion circuits comprising a first switching circuit 100, a binary-weighted capacitor array 200, a switch array 300, a differential amplifier 400 and control logic 500 as described thus far are known. In the conventional operation of such known analog-to-digital conversion circuits, the second, third and fourth switching circuits 302-304 are operated to ground the second, third and fourth capacitors 203-205 respectively, and the first switching circuit 100 is operated to apply an analog signal voltage to the signal node 201 of the capacitor array 200 for a brief sampling interval s as to charge the capacitors 202-205, the total charge on the capacitors 202-205 being proportional to the analog voltage during the sampling interval. The capacitors 202-205 act as a charge divider, accepting charge in proportion to their individual capacitances. During a subsequent coding interval, the second, third and fourth switching circuits 302-304 are then operated according to a known algorithm to connect selected ones of the second, third and fourth capacitors 203-205 to the positive or negative reference voltages so as to redistribute the charge on the capacitors 202-205 until the voltage on the signal node 201 is minimized. (See for example J.T. Caves et al, IEEE Transactions on Communications, Vol. Com-27, February 1979, p. 323-331, which is herein incorporated by reference.) During a subsequent sensing interval, the control logic circuit 500 senses the pattern of the reference voltages that is applied to the capacitors 203-205 to minimize the voltage at the signal node 201. This pattern determines the bit pattern for the digitally encoded sample of the analog signal.

Unfortunately, when such analog-to-digital converters are implemented as part of a monolithic integrated circuit, other signals may be capacitively coupled to the signal node 201 of the capacitor array 200. Such capacitive coupling causes a voltage offset at the signal node 201, and this voltage offset effectively shifts the decision levels for the digital encoding process away from their intended values, causing bit errors in the digitally encoded signal. For example, the sign bit of the digitally encoded signal may be present in the integrated circuit near the signal node 201 of the capacitor array 200 and may be coupled to the signal node 201 via parasitic capacitances to provide a time-varying voltage offset.

To reduce this problem, the analog to -digital converter circuit according to an embodiment of the invention further comprises a compensating signal generator 600. The compensating signal generator 600 responds to transitions of the error-producing signal (in this case the sign bit) to couple a compensating signal to the signal node 201 during the sampling interval and the coding interval. The compensating signal generator 600 comprises a fifth switching circuit 610, an inverter and level shifter 620 and a coupling capacitor 630 which is connected to the signal node 201. The fifth switching circuit 610 is connected to a node 612 which carries the sign bit (or whatever signal is known to be parasitically coupled to the signal node 201) and responds to a signal from the control logic circuit 500 to selectively couple the sign bit to the inverter and level shifter 620 during the sampling and coding intervals. The inverter and level shifter 620 inverts and scales the sign bit and applies the resulting signal to the coupling capacitor 630 which couples a charge proportional to the rate of change of the resulting sign bit onto the signal node 201. The inverter and level shifter 620 and coupling capacitor 630 are designed such that the injected charge effectively compensates for the charge which is parasitically coupled onto the signal node 201, thereby reducing coding errors due to the parasitic coupling.

Figure 3:
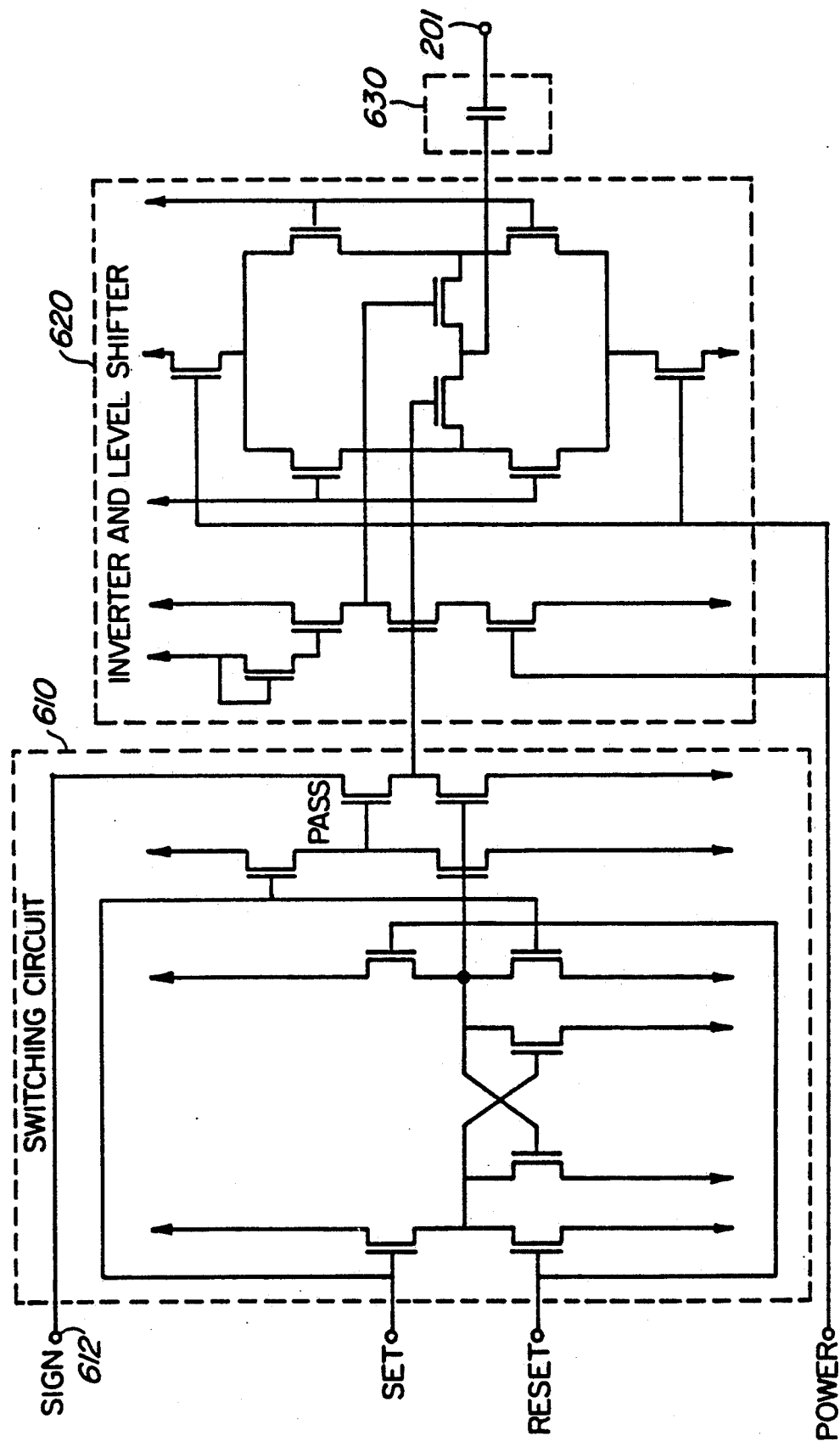
FIG. 3 is a schematic diagram showing further details of a compensating signal genera to r of the circuit of FIG. 1.
Figure 4:
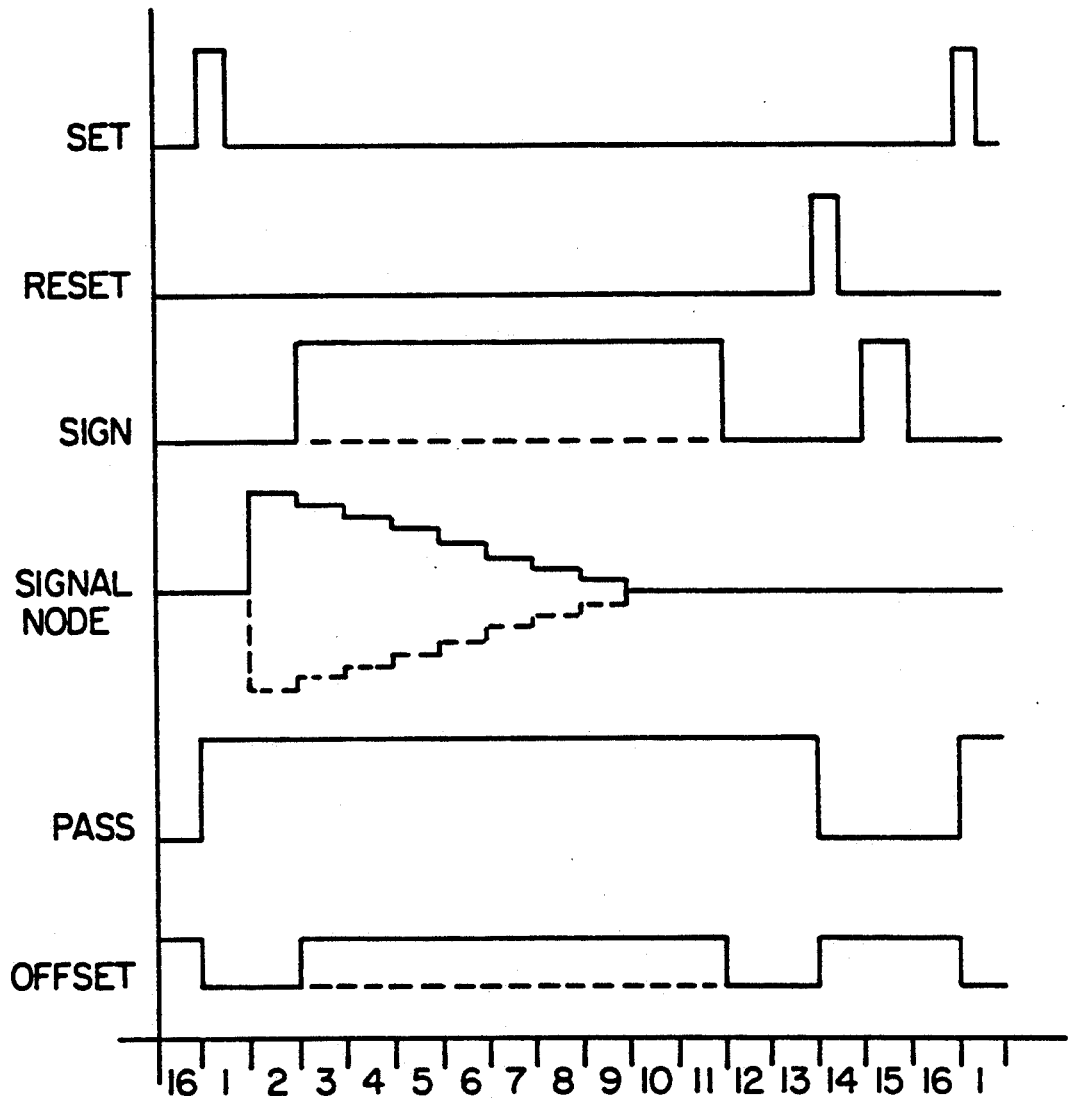
FIG. 4 is a timing diagram showing signals used in the operation of the circuit of FIG. 1.

FIG. 3 is a schematic diagram showing further details of a compensating signal generator 600, and FIG. 4 is a timing diagram showing signals used in the operation of the analog-to-digital conversion circuit. At the beginning of an analog-to-digital encoding operation, the control logic circuit 500 sends a "set" pulse to the fifth switching circuit 610. The "set" pulse sets the fifth switching circuit 610 s that the inverter and level shifter 620 responds to any changes in the sign bit appearing at the sign node 612.

The control logic circuit 500 then sends control signals to the second, third and fourth switching circuits 302-304 to ground the switched capacitors 203-205 of the capacitor array 200, and sends further control signals to the first switching circuit 100 to apply the analog signal to the signal node 201 during the sampling interval (time slot 2) so as to sample the analog signal by charging the capacitors 202-205. During a subsequent coding interval (time slots 3 to 10), the control logic circuit 500 sends control signals to the second, third and fourth switching circuits 302-304 according to the standard algorithm mentioned above. These control signals selectively apply the positive or negative reference voltage to individual capacitors 203-205 of the array 200 to redistribute the charge in such a manner as to minimize the voltage on the signal node 201. During a subsequent sensing interval (time slot 11), the control logic circuit 500 then senses the condition of the second, third and fourth switching circuits -304 when the voltage on the signal node 201 is minimized, and provides a three bit digital code, each bit of the code corresponding to the condition of a respective one of the second, third and fourth switching circuits 302-304.

If the sign bit changes during the sampling interval (time slot 2) or the coding interval (time slots 3 to 10), an error signal will be parasitically coupled to the signal node 201. However, because the fifth switching circuit 610 is set s as to apply the sign bit to the inverter and level shifter 620, a suitably scaled-down, shifted and inverted version of the sign bit is coupled to the signal node 201 by the coupling capacitor 630 to compensate for the parasitically coupled error signal. Because the inverter and level shifter 620 responds directly to the sign bit, the compensating signal compensates in real time for parasitic coupling of the sign bit to the signal node 201.

When the analog-to-digital conversion operation is complete, the control logic circuit 500 applies a "reset" pulse to reset the fifth switching circuit 610 in a condition which decouples the sign bit from the inverter and level shifter 620, coupling capacitor 630 and signal node 201 during a digital-t analog conversion interval (time slots 14 to 16). This operation of the fifth switching circuit 610 effectively defeats coupling of the compensating signal which responds to transitions of the sign bit to the signal node 201 during the digital-to-analog conversion interval. In the illustrated implementation, the "reset" pulse causes an offset signal to be present on the signal node 201 but, because this offset signal occurs during a time slot in which the signal node 201 is connected to analog ground, it has no effect on the digital-to-analog conversion.

Once the digital- to -analog conversion is complete, the control logic circuit 500 provides another "set" pulse to prepare the compensating signal generator 600 for digital encoding of the next analog sample.

As stated above, the inverter and level shifter 620 and coupling capacitor 630 are designed such that the injected charge effectively compensates for the charge which is parasitically coupled onto the signal node 201, thereby reducing coding errors due to the parasitic coupling. As the parasitic coupling can be difficult to predict during design and layout of the integrated circuit, it is advantageous to employ a capacitor structure for which the capacitance of the coupling capacitor 630 is determined by a single mask of a set of masks used to fabricate the integrated circuit. The capacitance of the coupling capacitor 630 can then be adjusted as necessary by modifying only a single mask.

The embodiment described above can be modified without departing from the invention. For example, further capacitors could be added to the binary weighted capacitor array 200 along with corresponding switching circuits added to the switch array 300 to provide for digital words having more than three bits.

Parasitically coupled error signals other than those resulting from the sign bit could be compensated by coupling the appropriate error-producing signal to the appropriate node 612. Where more than one error-producing signal is involved, the error-producing signals could be appropriately weighted and summed, and the resulting composite signal could be applied to the appropriate node 612.

The error producing signal could be coupled directly to the inverter and level shifter 620, and a switching circuit could be connected between the inverter and level shifter 620 and the coupling capacitor 630, or between the coupling capacitor 630 and the capacitor array 200 to defeat coupling of the compensating signal to the signal node 201 during the digital-to-analog conversion interval.

It is not essential that the compensating signal generator 600 couple an offset signal to the signal node 201 during the digital-to-analog conversion interval.

These and other modifications are within the scope of the invention as claimed below.

I claim:

1. An analog-to-digital converter, comprising:
  a binary-weighted capacitor array;
  means for applying an analog signal to a signal node of the capacitor array to charge capacitors of the capacitor array;
  means responsive to transitions of an error-producing signal to couple a compensating signal to the signal node to compensate for parasitic coupling of the error-producing signal to the signal node; and
  means for selectively applying a reference voltage to individual capacitors of the array to redistribute charge among the capacitors and to thereby minimize a voltage at the signal node.

2. An analog-to-digital converter as defined in claim 1, wherein the means responsive to transitions of an error-producing signal to couple a compensating signal to the signal node comprises:
  an inverting and level shifting circuit responsive to the error-producing signal; and
  a coupling capacitor connected between the inverting and level shifting circuit and the signal node.

3. An analog-to-digital converter as defined in claim 2, further comprising switching means operable to defeat coupling of the compensating signal to the signal node during selected time intervals.

4. A method for converting an analog signal to a digital signal, comprising:
  applying an analog signal to a signal node of a binary-weighted capacitor array during a sampling interval to charge capacitors of the capacitor array;
  selectively applying a reference voltage to individual capacitors of the array during a coding interval t redistribute charge among the capacitors and to thereby minimize a voltage at the signal node; and
  sensing which capacitors of the array have the reference voltage applied thereto for minimizing the voltage at the signal node during a sensing interval,
  the method further comprising coupling a compensating signal responsive to transitions of an error-producing signal to the signal node during the sampling and coding intervals.

5. A method as defined in claim 4, wherein the compensating signal is derived from the error producing signal by inverting and level shifting the error-producing signal and capacitively coupling the resulting signal to the signal node.

6. A method as defined in claim 5, wherein the capacitor array is used for both analog-to-digital conversion and digital-to-analog conversion, further comprising defeating the coupling of the compensating signal to the signal node while the capacitor array is used for digital-to-analog conversion.

* * * * *